United States Patent [19]

Smith

[11] Patent Number: 4,812,135
[45] Date of Patent: Mar. 14, 1989

[54] FLEXIBLE ELECTRICAL CONNECTORS

[75] Inventor: Arthur R. Smith, Lexden, England

[73] Assignee: The General Electric Company, p.l.c., London, England

[21] Appl. No.: 758,972

[22] Filed: Jul. 25, 1985

[30] Foreign Application Priority Data

Jul. 26, 1984 [GB] United Kingdom ............... 8419100

[51] Int. Cl.⁴ .................. H01R 25/00; H01B 7/08
[52] U.S. Cl. .......................... 439/493; 174/117 F; 174/117 FF; 174/117 PC
[58] Field of Search ......... 174/117 R, 117 F, 117 FF, 174/117 PC, 117 A, 119 R; 339/17 F, 176 MF; 361/398; 439/492, 493

[56] References Cited

U.S. PATENT DOCUMENTS

| 3,086,071 | 4/1963 | Preston | 174/117 PC |
|---|---|---|---|
| 3,387,248 | 6/1968 | Rees | 174/117 R |
| 3,523,844 | 4/1970 | Crimmins et al. | 174/117 F |
| 3,727,168 | 4/1973 | Henschen et al. | 339/17 F |
| 3,728,661 | 4/1973 | Kassabgi | 174/117 F X |
| 3,749,959 | 7/1973 | Schmersal et al. | 174/117 PC X |
| 3,772,776 | 11/1973 | Weisenburger | 361/398 X |
| 4,098,628 | 4/1978 | Walton | 174/117 F X |
| 4,123,753 | 10/1978 | Gravert | 174/117 F X |
| 4,220,812 | 9/1980 | Ney et al. | 174/117 R X |
| 4,375,379 | 3/1983 | Luetzow | 174/117 F X |
| 4,425,475 | 1/1984 | Ward et al. | 174/117 F |
| 4,449,012 | 5/1984 | Voser | 174/117 F X |

FOREIGN PATENT DOCUMENTS

| 66910 | 12/1982 | European Pat. Off. | 174/117 F |
|---|---|---|---|
| 79638 | 5/1983 | European Pat. Off. | |
| 2179544 | 11/1973 | France | |
| 414713 | 8/1934 | United Kingdom | |
| 1481746 | 8/1977 | United Kingdom | |
| 2027553 | 2/1980 | United Kingdom | |
| 2120837 | 12/1983 | United Kingdom | |

Primary Examiner—Morris A. Nimmo

[57] ABSTRACT

Flexible electrical connectors are employed to connect rigid members, such as plugs and printed circuit boards. Such connectors have a tendency to tear, especially in the region near the rigid member, and this can prove expensive to remedy. The invention provides reinforcing thread members, for example, along the connector which prevent any tear which may develop from growing further.

19 Claims, 2 Drawing Sheets

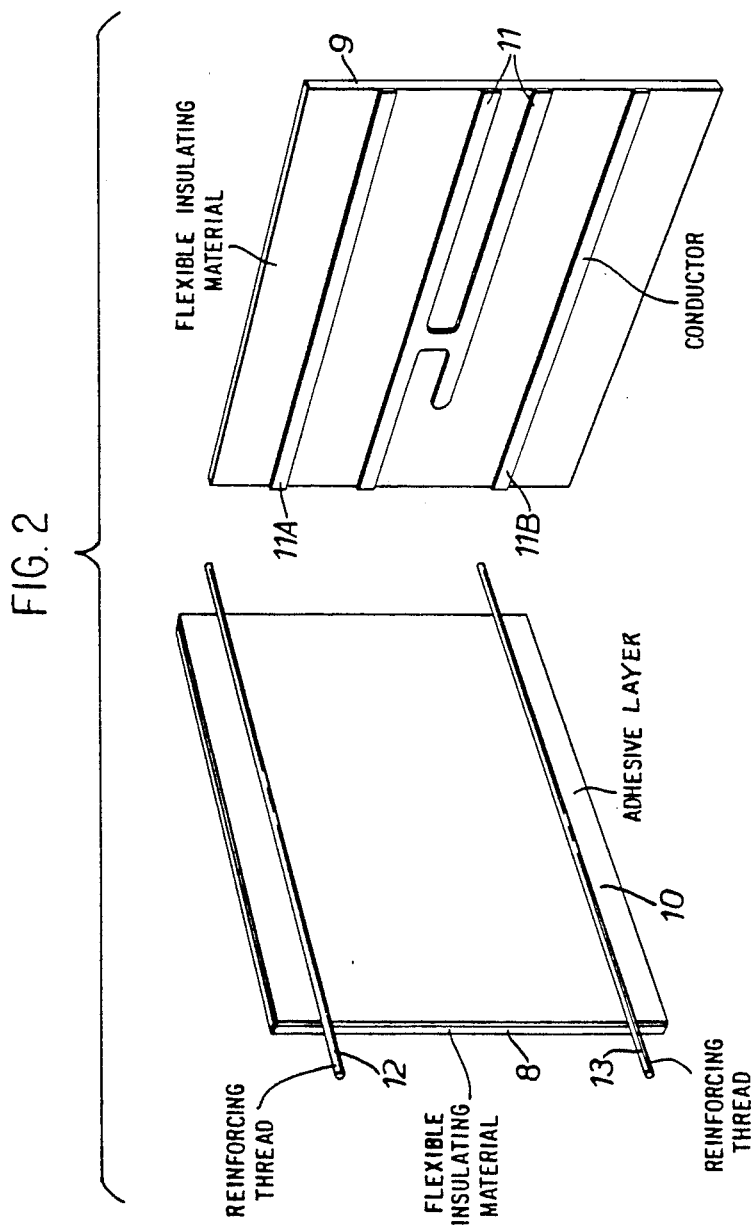

FLEXIBLE ELECTRICAL CONNECTORS

BACKGROUND OF THE INVENTION

This invention relates to flexible electrical connectors, and in particular flat connectors which comprise a flexible layer of insulating material bearing a conductive track, i.e., a flat, thin layer of conductive material.

The use of flexible electrical connectors is particularly advantageous where electrical connections must be made between two rigid members in a confined volume, since a desired arrangement of the members may be more readily realised. More efficient use of the available space may thus be achieved than if a rigid connector is used, or the members to be connected are placed immediately adjacent one another.

However, the insulating material can be prone to tearing, and a tear, once started, may continue across a great portion of the material, and also across the conductive track or tracks carried by it. Such a tear may be difficult and expensive to repair and could entail the dismantling of one of the connected parts. This part might be a printed circuit board of a type which has a continuation of the flexible connector sandwiched between rigid sheets carrying circuitry and components. If a tear occurs near the printed circuit board it may be necessary to remove the components it carries to effect a repair, and in doing so, the components are almost inevitably damaged, or at least may be tested to ascertain whether any damage has been sustained. In fact it may be more economical in these circumstances to reject the printed circuit board and flexible connector rather than attempt to repair the tear, and to fit a new board and connector, even though this may be expensive, costing perhaps, hundreds of pounds.

The inventor has now realised that this problem can be overcome in a very simple and inexpensive way.

SUMMARY OF THE INVENTION

According to a first aspect of the invention there is provided a flexible electrical connector comprising two layers of insulating material having a conductor between them characterised by a flexible reinforcing member which is secured along its length between at least one edge of the connector and the conductor and which is of greater strength against tearing than the conductor.

The member may be secured along its whole length or along only part of its length and may be readily incorporated in the connector with little disruption to the techniques applied in manufacturing conventional flexible connectors.

Preferably the reinforcing member is a thread.

According to a second aspect of the invention there is provided a flexible electrical connector comprising a conductor sandwiched between two layers of insulating material, and a reinforcing thread member extending along the insulating material between at least one edge thereof and the conductor.

The member may be located between the two layers or may be present on the surface of a layer which does not face the other layer. It could be present on the same surface of the layer as the conductor or on the other surface of the layer.

The thread may be a single fibre or a plurality of twisted fibres or yarn. It could be of a natural material or a synthetic, such as polyamide, and preferably it is of an aromatic polyamide (such or is sold under the trademark Kevlar). A thread can have great strength and yet is flexible so that it does not impair the flexibility of the connector. The use of a thread, i.e. an elongate member having substantially circular cross-section, is of particular significance, in that it is likely to be more resistant to tearing then other possible reinforcing members in the form, for example, of flat strips etc.

It is preferred that the reinforcing member is attached along substantially its entire length to a layer of insulating material, although it could be secured only at spaced points along its length.

Preferably the member is attached to one layer of insulating material by adhesive, which may, for example, be a heat setting adhesive, in which case the thread must be of a type undamaged by the heat required during manufacture.

Preferably the two layers of insulating material are formed of a polyimide (such as is sold under the trademark Kapton).

According to a third aspect of the invention there is provided a flexible electrical connector comprising a sheet of insulating material bearing a conductor, and a flexible reinforcing member attached to the sheet between one edge thereof and the conductor.

Apparatus may include a connector as described above to connect a rigid member having electrical circuitry to other circuitry.

According to a fourth aspect of the invention a method of manufacturing a flexible electrical connector includes taking a sheet of insulating material having adhesive on one surface thereof; taking a sheet of insulating material having a conductor on one surface thereof; arranging the surfaces of the sheets having adhesive and the conductor thereon to face each other; placing a reinforcing elongate member between them, and bringing them together.

Preferably the conductor is defined by etching a layer of conductive material initially present on the sheet. Also preferably the sheets and the member are bonded by heating them when they are brought together to heat set the adhesive.

BRIEF DESCRIPTION OF THE DRAWINGS

One way in which the invention may be performed is now described by way of example, with reference to the accompanying drawings, in which:

FIG. 2 illustrates the manufacturing process for of the flexible connector of FIG. 1, like parts having like references throughout.

DETAILED DESCRIPTION OF THE PREFERRED EMBODIMENT

Figure 1:
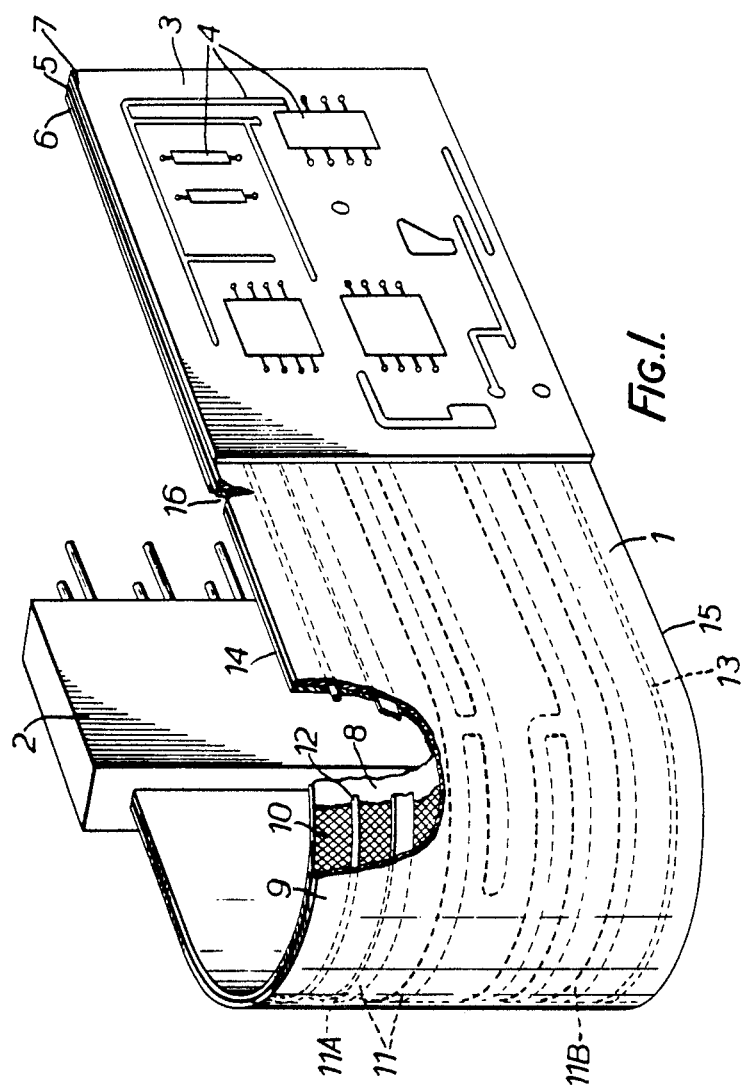
FIG. 1 shows schematically, and partially broken away, a flexible electrical connector in accordance with the invention.

With reference to FIG. 1, a flexible electrical connector 1 is arranged to electrically connect two rigid members, a plug 2 and a printed circit board 3, the surface of which carries various components and interconnecting tracks 4 which are only schematically indicated. The printed circuit board 3 includes a continuation 5 of the flexible connector 1 sandwiched between two rigid sheets 6 and 7.

The flexible connector comprises first and second layers 8 and 9 of polyimide, which is an insulating material, held together by an intermediate adhesive layer 10 (shown cross-hatched), and, sandwiched between the polyimide layers 8 and 9, a plurality of copper conductors 11 and two reinforcing thread members 12 and 13. The reinforcing thread members 12 and 13 are of polyamide, which is a strong, flexible material capable of withstanding the temperature required to heat set the adhesive during manufacture.

One thread member 12 is positioned substantially parallel to and between the top edge 14 of the connector as shown and the conductor 11A nearest to it, and the other member 13 is positioned between the bottom edge 15 of the connector and the conductor 11B, which is closest to it. A tear 16 is shown as having developed in the connector 1 from its top edge 14 and close to the printed circuit board 3. This is a common place for a tear to occur in this arrangement, for example during assembly, even a slight twist between the printed circuit board 3 and connector 1 being liable to result in a tear. The tear 16 only extends downwards as far as the top thread member 12, which, because of its resistance to tearing, prevents the tear 16 from growing further, which it would otherwise do, and hence eliminates the need for any costly and difficult repairs.

In manufacturing the flexible connector 1, the second layer 9 prior to assembly as shown in FIG. 2, has copper laid down on one surface which is etched, using conventional techniques to obtain the desired conductors 11. The first layer 8 has a heat-setting adhesive layer 10 on its surface which is arranged to face the conductors 11. The first and second layers 8 and 9 are brought together and the thread members 12 and 13 inserted between them in the correct position. Heat is then applied to cause the adhesive to bond together the two layers 8 and 9 and the intermediate thread members 12 and 13, and conductors 11.

Although in the embodiment described above with reference to FIGS. 1 and 2 the reinforcing thread members 12 and 13 are substantially the same length as the strip of flexible electrical connector 1 between the two rigid members 2 and 3, they could be shorter. This might be the case where a particular portion of a certain configuration of flexible connector tends to tear, the flexible reinforcing member being included at that portion only. For example, if the flexible connector includes a right angled bend the reinforcing member could be present across the turn and for a short distance on either side of it only.

In an alternative embodiment (not shown), the flexible reinforcing member could be secured to one surface of an insulating layer, the other surface of which is adjacent a second insulating layer, with a conductor being present between the two layers. The flexible reinforcing member could be secured by adhesive or by some other means, such as a further insulating layer placed over it.

I claim:

1. In a flexible electrical connector comprising two layers of insulating material having a flat thin conductor, of the type formed by printed circuit and similar techniques, between them; the improvement comprising a flexible reinforcing thread which is secured along its length to at least one of said layers between at least one edge of the connector and the conductor track, which is of greater strength against tearing than the conductor, and which is sufficiently flexible so as not to impair the flexibility of the connector.

2. A connector as claimed in claim 1 wherein the thread is attached along substantially its entire length to at least one layer of insulating material.

3. A connector as claimed in claim 1 wherein the thread is formed of an aromatic polyamide.

4. A connector as claimed in claim 1 wherein the thread is attached to at least one layer of insulating material by an adhesive.

5. A connector as claimed in claim 1 wherein the conductor is defined by the etching of a thin layer of conductive material laid on one layer of insulating material.

6. A connector as claimed in claim 1 wherein the conductor is of copper.

7. A connector as claimed in claim 1 wherein the two layers are formed of a polyimide.

8. A flexible electrical connector comprising a flat thin conductor of the type formed by printed circuit and similar techniques sandwiched between two layers of insulating material, and a reinforcing thread extending along and secured to the insulating material between at least one edge thereof and the conductor, said reinforcing thread having a greater strength against tearing then said conductor and being sufficiently flexible so as not to impair the flexibility of the connector.

9. A connector as claimed in claim 8 wherein the thread is attached along substantially its entire length to at least one layer of insulating material.

10. A connector as claimed in claim 8 wherein the thread is formed of an aromatic polyamide.

11. A connector as claimed in claim 8 wherein the thread is attached to at least one layer of insulating material by adhesive.

12. A connector as claimed in claim 8 wherein the conductor is defined by the etching of a thin layer of conductive material laid on one layer of insulating material.

13. A connector as claimed in claim 8 wherein the conductor is of copper.

14. A connector as claimed in claim 8 wherein the two layers are formed of polyimide.

15. Apparatus including a rigid member having electrical circuitry connected to other electrical circuitry by a flexible electrical connector which comprises two layers of insulating material having a flat thin conductor, of the type formed by printed circuit and similar techniques, between them, and a flexible reinforcing thread secured along its length to at least one of said layers between at least one edge of the connector and the conductor, and said flexible reinforcing thread being of greater strength against tearing then the conductor, and being sufficiently flexible so as not to impair the flexibility of the connector.

16. Apparatus including a rigid member having electrical circuitry connected to other electrical circuitry by a flexible electrical connector which comprises a flat thin conductor of the type formed by printed circuit and similar techniques sandwiched between two layers of insulating material, and a reinforcing thread extending along and secured to the insulating material between at least one edge thereof and the conductor, said reinforcing thread having a greater strength against tearing than said conductor and being sufficiently flexible so as not to impair the flexibility of the connector.

17. A flexible electrical connector as claimed in claim 1 wherein two of said flexible reinforcing threads are provided with each of said threads being secured adjacent a respective edge of the connector.

18. In a flexible flat electrical connector which is normally prone to tearing in a direction transverse to its length, said connector comprising a first elongated flexible sheet of insulating material having a plurality of thin flat flexible electrical conductors formed on one surface of same and extending along the length thereof, and a further elongated flexible sheet of insulating material secured to said one surface of said first sheet and covering said one surface and said conductors; the improvement comprising first and second reinforcing threads disposed between and secured to said layers of insulating material, each of said threads extending along the length of said connector between a respective edge of said connector and the adjacent one of said conductors, being formed of a synthetic material, having a greater strength against tearing than said conductors, and having a flexibility which will not impair the flexibility of said connector.

19. In a flexible electrical connector including a flat thin conductor of the type formed by printed circuit and similar techniques disposed on the surface of a flexible sheet of insulating material and extending along the length of said sheet the improvement comprising: a reinforcing thread extending along the length of, and secured to, said sheet of insulating material between at least one edge of said sheet and the conductor, said reinforcing thread having a greater strength against transverse tearing than said conductor and being sufficiently flexible so as not to impair the flexibility of the connector.

* * * * *